(12) United States Patent
Kim

(10) Patent No.: US 7,859,290 B2
(45) Date of Patent: Dec. 28, 2010

(54) APPARATUS AND METHOD FOR MEASURING EFFECTIVE CHANNEL

(75) Inventor: Chul-Soo Kim, Seoul (KR)

(73) Assignee: Dongbu HiTek Co., Ltd., Seoul (KR)

( * ) Notice: Subject to any disclaimer, the term of this patent is extended or adjusted under 35 U.S.C. 154(b) by 295 days.

(21) Appl. No.: 12/059,380

(22) Filed: Mar. 31, 2008

(65) Prior Publication Data

US 2008/0246506 A1    Oct. 9, 2008

(30) Foreign Application Priority Data

Apr. 6, 2007    (KR) .................... 10-2007-0033948

(51) Int. Cl.
*G01R 31/26* (2006.01)

(52) U.S. Cl. .................... 324/769; 324/765; 324/158.1; 257/48; 438/18

(58) Field of Classification Search ......... 324/765–769, 324/158.1; 257/48; 438/14–18
See application file for complete search history.

(56) References Cited

U.S. PATENT DOCUMENTS

| | | | | |
|---|---|---|---|---|
| 5,821,766 A * | 10/1998 | Kim et al. | .................... | 324/769 |
| 6,750,673 B1 * | 6/2004 | Huang et al. | ................. | 324/769 |
| 7,315,174 B2 * | 1/2008 | Jang | ........................... | 324/671 |
| 2006/0261840 A1 * | 11/2006 | Hoon et al. | .................. | 324/769 |

* cited by examiner

*Primary Examiner*—Ha Tran T Nguyen
*Assistant Examiner*—Emily Y Chan
(74) *Attorney, Agent, or Firm*—Sherr & Vaughn, PLLC

(57) ABSTRACT

An apparatus and a method for measuring an effective channel. The apparatus includes an automatic measurement system including a testing terminal for a substrate, a switching matrix disposed at one side of the automatic measurement system, a leakage current measuring device and a capacitance measuring device electrically connected to the switching matrix by a predetermined terminal, and a controller which controls the automatic measurement system, the leakage current measuring device, and the capacitance measuring device.

9 Claims, 5 Drawing Sheets

APPARATUS AND METHOD FOR MEASURING EFFECTIVE CHANNEL

The present application claims priority under 35 U.S.C. 119 and 35 U.S.C. 365 to Korean Patent Application No. 10-2007-0033948 (filed on Apr. 6, 2007), which is hereby incorporated by reference in its entirety.

BACKGROUND

In CMOS technology, a channel length and a channel width are important parameters in estimation of a short channel design, a process monitoring and performance of a circuit model.

SUMMARY

Embodiments relate to an apparatus and a method for measuring an effective channel, capable of automatically measuring gate leakage and capacitance by an auto system.

Embodiments relate to an apparatus and a method for measuring an effective channel, capable of easily obtaining capacitance among a gate, a source, and a drain without grounding a bulk terminal.

Embodiments relate to an apparatus and a method for measuring an effective channel, capable of effectively removing the gate leakage of a transistor.

Embodiments relate to an apparatus for measuring an effective channel, including at least one of the following: an automatic measurement system including a testing terminal for a substrate, a switching matrix disposed at one side of the automatic measurement system to control the testing terminal, a leakage current measuring device and a capacitance measuring device electrically connected to the switching matrix by a predetermined terminal, and a controller which controls the automatic measurement system, the leakage current measuring device, and the capacitance measuring device.

Embodiments relate to a method for measuring an effective channel, including at least one of the following steps: loading a substrate formed with a gate, a source, and a drain into an apparatus for measuring the effective channel, measuring a first modified capacitance having no leakage component among the source, the drain, a bulk, and the gate with respect to an inversion region and an accumulation region of the substrate, measuring a second modified capacitance having no leakage component between the bulk and the gate with respect to the inversion region and the accumulation region of the substrate, measuring an overlap capacitance by using the first modified capacitance and the second modified capacitance, and measuring an effective channel width by using the overlap capacitance.

In accordance with embodiments, an automated system is employed instead of a manual system, thereby removing error factors which may occur when measuring the effective channel. Accordingly, exact parameters may be extracted. In addition, it can become unnecessary to ground a bulk terminal by using another terminal, and the capacitance among a gate, a source, and a drain can be easily and precisely obtained.

DRAWINGS

Figure 1:
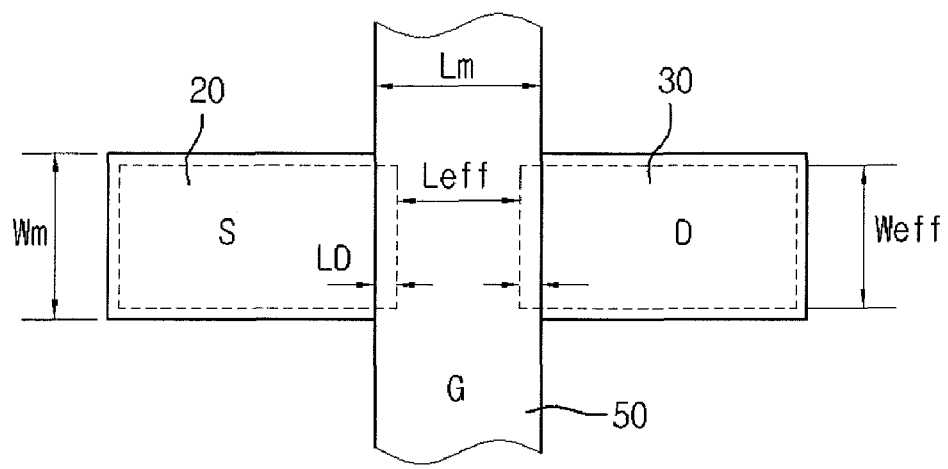

Example FIG. 1 illustrates differences between a mask channel and an effective channel.

Figure 2:
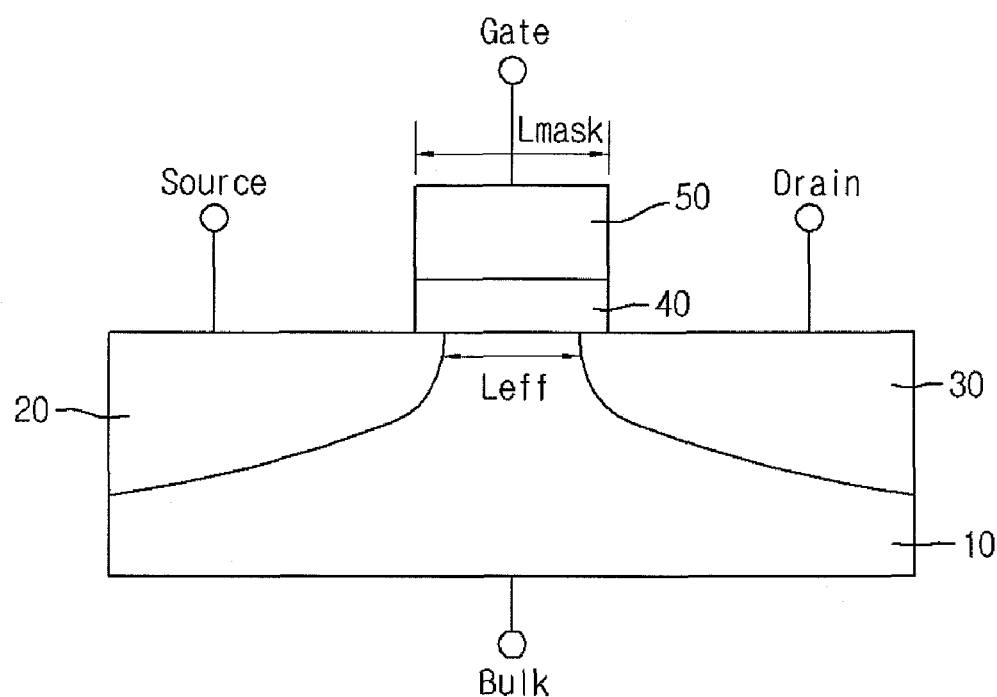

Example FIG. 2 illustrates differences between a mask channel length and an effective channel length.

Figure 3:
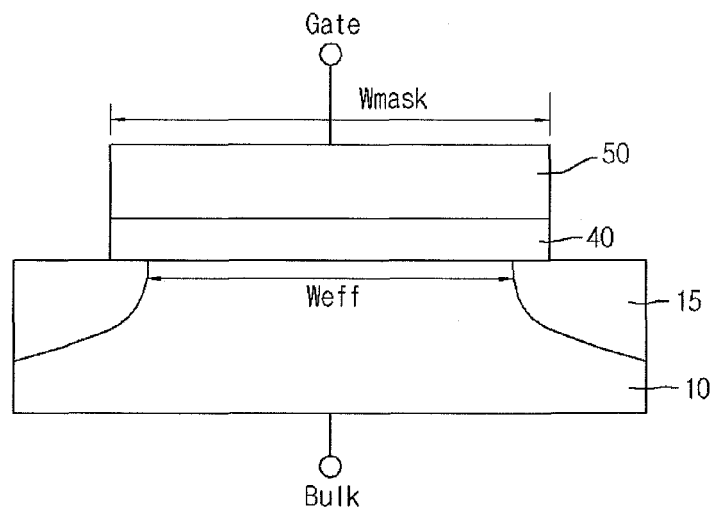
Figure 4:
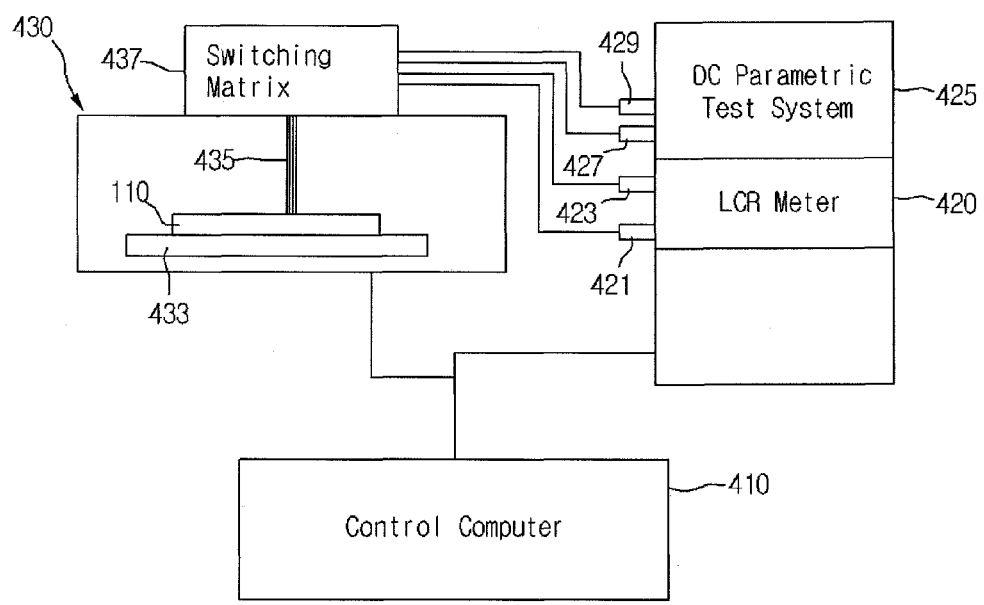

Example FIG. 3 illustrates differences between a mask channel width and an effective channel width;

Example FIG. 4 illustrates an apparatus for measuring an effective channel, in accordance with embodiments.

Figure 5:
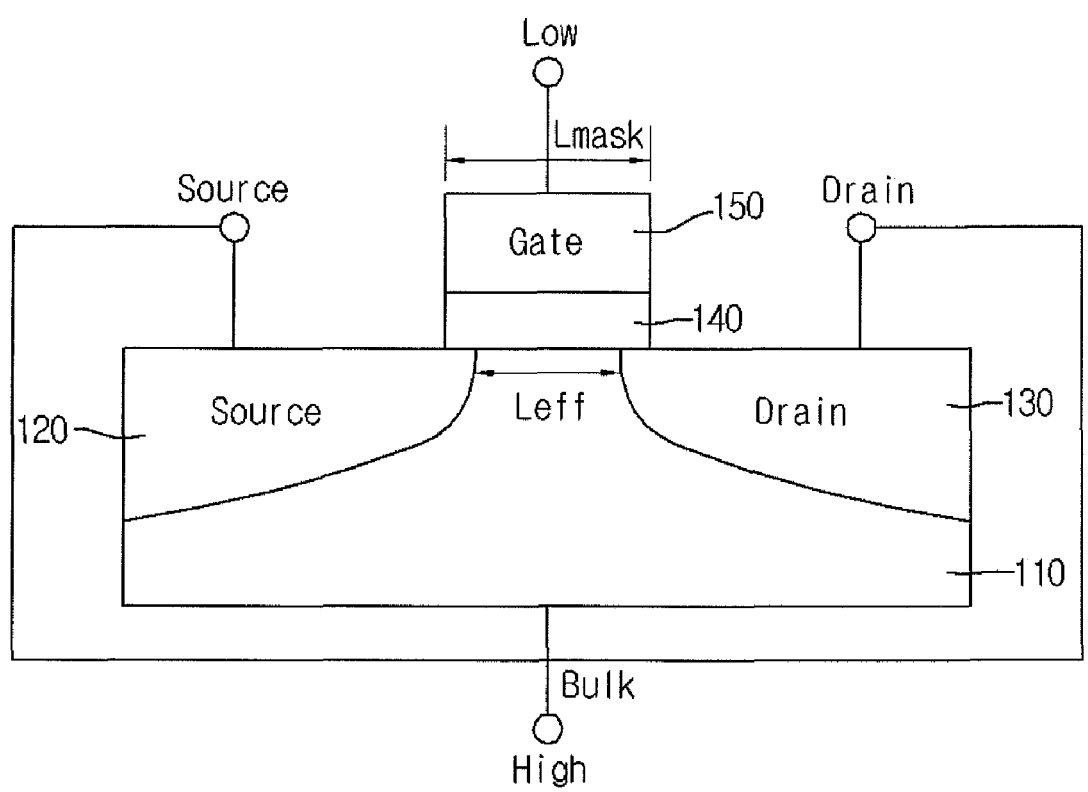
Figure 6:
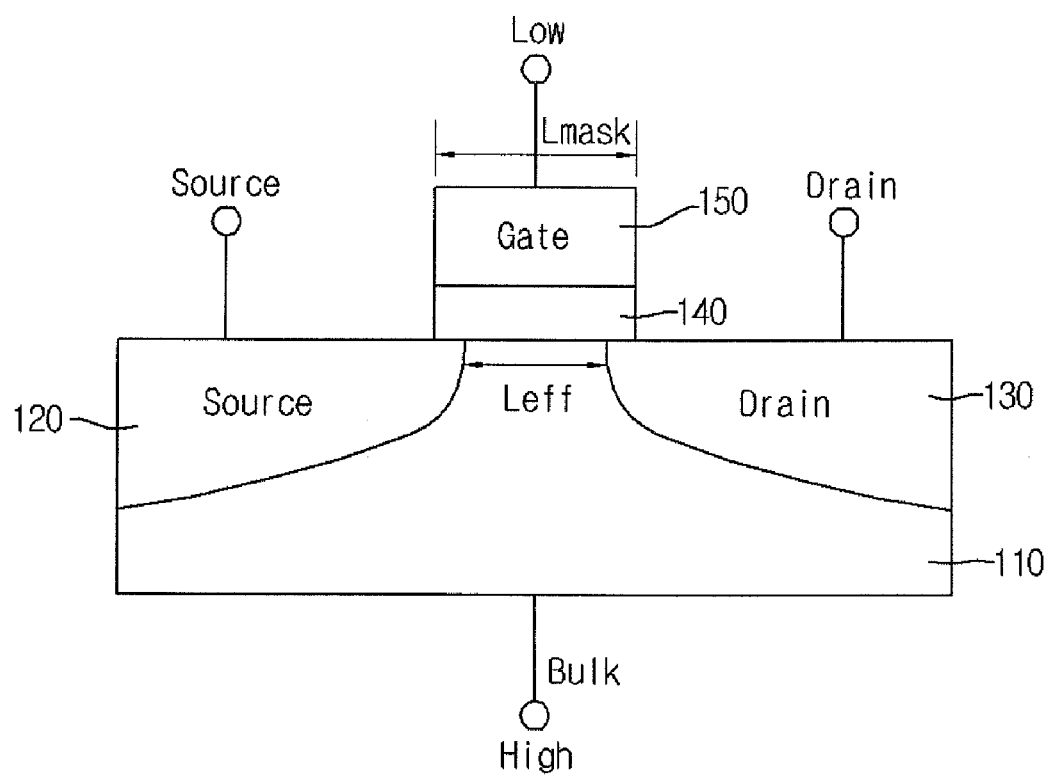

Example FIGS. 5 and 6 are circuit diagrams illustrating a method for measuring an effective channel, in accordance with embodiments.

Figure 7:
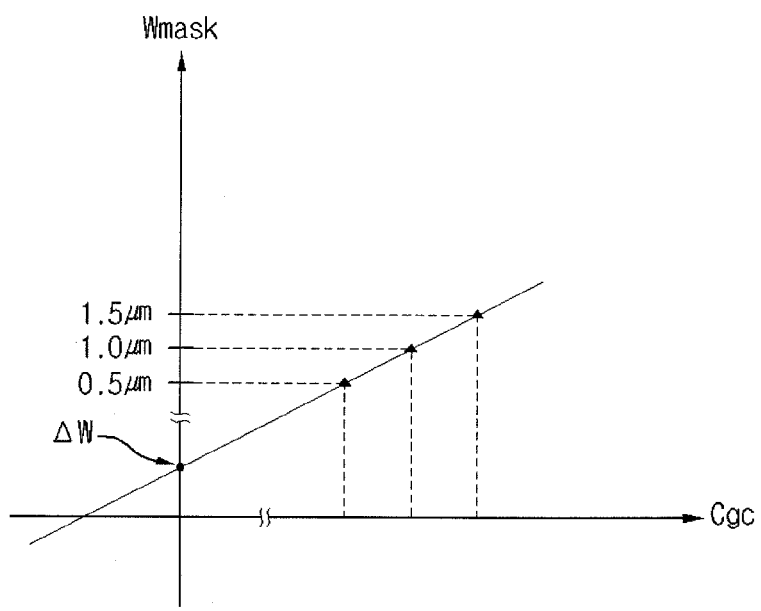

Example FIG. 7 is a graph illustrating a method for measuring an effective channel width, in accordance with embodiments.

Figure 8:
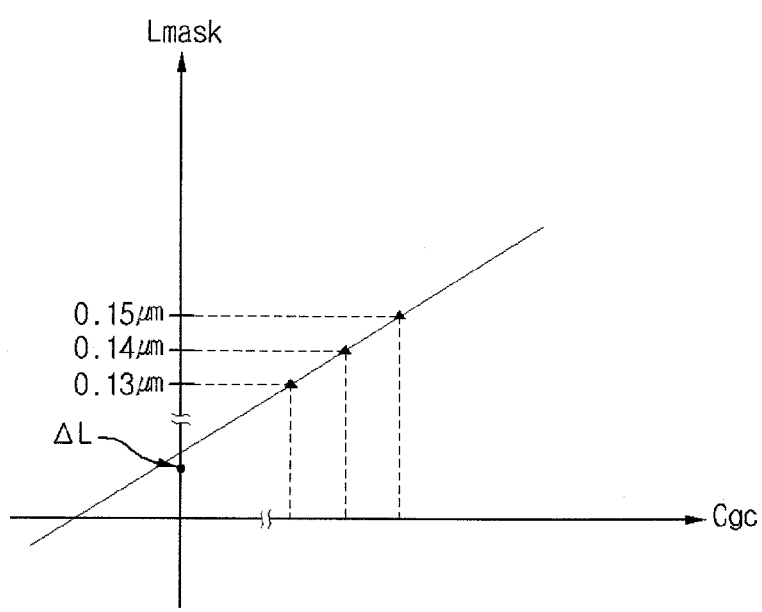

Example FIG. 8 is a graph illustrating a method for measuring an effective channel length, in accordance with embodiments.

DESCRIPTION

As illustrated in example FIG. 1, mask channel width $W_{mask}$ and mask channel length $L_{mask}$ are different from an effective channel width $W_{eff}$ and an effective channel length $L_{eff}$ after an actual process has been performed.

In other words, as illustrated in example FIGS. 1 and 2, diffusion regions of source 20 and drain 30 can be enlarged to a channel region through lateral diffusion LD, such that the final effective channel length can be obtained. In this manner, both sides of effective channel length $L_{eff}$ can be reduced due to lateral diffusion LD when compared to mask channel length $L_{mask}$.

As illustrated in example FIGS. 1 and 3, when an actual process is performed, field oxide region 15 used for insulating semiconductor substrate 10 can penetrate into an active region of a device to obtain an actual effective channel width $W_{eff}$ narrower than mask channel width $W_{mask}$ defined on a mask.

As CMOS technology is scaled down, the need for manufacturing thinner CMOS becomes more necessary. However, during manufacturing of the CMOS, the junction of source 20 and drain 30 can become vertically or horizontally diffused, thereby creating differences between mask channel length $L_{mask}$ and mask channel width $W_{mask}$, and also effective channel length $L_{eff}$ and effective channel width $W_{eff}$, respectively. Therefore, it is important to exactly recognize the effective channel length and the effective channel width based on the accurate detection of these differences.

The differences can be defined through the following equations.

$$L_{eff} = L_{mask} - \Delta L$$

$$W_{eff} = W_{mask} - \Delta W$$

In this case, an electrical channel length and an electrical channel width represent the effective channel length $L_{eff}$ and the effective channel width $W_{eff}$, respectively. In other words, the electrical channel length and electrical channel width represent an actual channel length and an actual channel width of a device, respectively.

In order to extract the parameters, a drain current method and a capacitance method have been suggested. However, during development of CMOS technology, a transistor can be scaled down to a deep sub-micron level. Accordingly, current source is generated due to the serious variation of mobility derived from a gate voltage, the tunneling of gate insulating layer 40, and the poly depletion of gate 50, so that exact values cannot be obtained.

In a capacitance method gate 50 can be connected to a high terminal, source 20 and drain 30 can be shorted and then connected to a low terminal, and bulk 10 can be maintained as the ground, so as to measure capacitance. In this case, capacitance distortion can occur in the low terminal due to a noise component introduced from a ground area.

Moreover, in order to measure gate leakage and capacitance, a manual system set by a user can be employed. In essence, since the gate leakage can be measured by a DC meter, and the capacitance can be measured by equipment using a capacitor, the measurement of the gate leakage and the capacitance may be difficult, and time or economical loss may occur.

As illustrated in example FIG. 4, an apparatus for measuring the effective channel in accordance with embodiments can include automatic measurement system 430, leakage current measuring device 425, capacitance measuring device 420, switching matrix 437, and control computer 410.

The apparatus for measuring the effective channel in accordance with embodiments relates to devices for measuring an effective channel length and an effective channel width of substrate 110 formed thereon with a gate, a source, and a drain. Thus, the automatic measurement system 430 can includes a chuck 433 for supporting substrate 110, and testing terminal 435 for connection to substrate 110.

An advantage of the system in accordance with embodiments is leakage current measuring device 425 and capacitance measuring device 420 of substrate 110 may cooperate with and are connected to automatic measurement system 430. Particularly, leakage current measuring device 425 can be electrically connected to automatic measurement system 430 through switching matrix 437 at high terminal 429 and low terminal 427. Capacitance measuring device 420 can be electrically connected to automatic measurement system 430 through switching matrix 437 at high terminal 423 and low terminal 421.

Control computer 410 can serve to control automatic measurement system 430, leakage current measuring device 425, capacitance measuring device 420 and switching matrix 437. Leakage current measuring device 425 and capacitance measuring device 420 can be integrated into a single unit, and selectively and electrically connected to automatic measurement system 430 through switching matrix 437, thereby constructing an automated system.

In accordance with embodiments, in the apparatus for measuring the effective channel the automated system can be employed instead of a manual system to extract exact or otherwise precise parameters by removing error factors occurring when measuring the effective channel.

In accordance with other technologies, gate leakage and capacitance can be separately measured using a DC meter and a capacitor, respectively, through a manual system. In using such a system, however, it is difficult to measure the effective channel, which may result in a loss of time and money. Therefore, the apparatus for measuring the effective channel in accordance with embodiments can perform effective measurement by using an algorithm for the automated system in order to solve the above problem.

A method for measuring an effective channel in accordance with embodiments will be schematically described. Example FIG. 5 illustrates the measurement of the capacitance $C_{bsd}$ between a bulk, source, drain and a gate while example FIG. 6 illustrates the measurement of the capacitance $C_b$ of a bulk and a gate.

Source 120 and drain 130 can be connected to a bulk in inversion and accumulation regions, thereby measuring the leakage capacitance among gate 150, substrate (bulk), source 120 and drain 130. A leakage component can then be removed from the leakage capacitance, thereby obtaining capacitance $C_{bsd}$ between substrate 110 (bulk), source 120, drain 130 and gate 150.

The above method is repeatedly performed between the bulk and gate 150, thereby obtaining capacitance $C_b$ between the bulk and gate 150. Overlap capacitance $C_{sd}$ between source 120, drain 130 and gate 150 can be obtained using capacitance $C_b$ and capacitance $C_{bsd}$. Gate channel capacitance $C_{gc}$ can then be obtained, so that the effective channel width and the effective channel length can be obtained through the following equation.

$$C_{gc}=C_{sd\_inv}-C_{sd\_acc}=C_{ox}WL=C_{ox}W_{mask}(L_{mask}-\Delta L)=C_{ox}L_{mask}(W_{mask}-\Delta W)$$

As illustrated in example FIG. 5, substrate 110 formed with gate 150, source 120 and drain 130 can be loaded into the device for measuring an effective channel length by loading substrate 110 on chuck 433.

Next, the first modified capacitance having no leakage component among source 120, drain 130, substrate (bulk) 110 and gate 150 can be measured with respect to the inversion area and the accumulation region of substrate 110.

The steps of measuring the first modified capacitance are as follows. First, terminals are connected to source 120, drain 130, substrate (bulk) 110 and gate 150. As illustrated in example FIG. 5, a high terminal can be connected to substrate (bulk) 110, source 120 and drain 130, and a low terminal can be connected to gate 150. Operation voltage $V_g$ can then be applied to gate 150 using leakage current measuring device 425, thereby measuring leakage current $I_{leak\_bsd\_inv}$ of the inversion region and leakage current $I_{leak\_bsd\_acc}$ of the accumulation region.

An example of the inversion region will be described as follows. If substrate 110 is a P-type substrate, the inversion region can be formed only when gate voltage $V_g$ is positive (+) and exceeds at least threshold voltage $V_T$. In order to form the accumulation region, if the substrate is a P-type substrate, gate voltage $V_g$ must be negative (−).

Next, the high terminal is connected to source 120, drain 130, substrate (bulk) 110, and the low terminal is connected to gate 150 using capacitance measuring device (LCR meter) 420, thereby measuring capacitance $C_{bsd\_inv}$ of the inversion region and capacitance $C_{bsd\_acc}$ of the accumulation region. In this case, the LCR meter can measure the characteristic value shown in each element, i.e., the characteristic values of a resistor (R), an inductor (L), and a capacitor (C).

Then, the first modified capacitance having no leakage component can be obtained in which first modified capacitance $C_{bsd\_inv\_mod}$ of the inversion region is $C_{bsd\_inv\_mod}=C_{bsd\_inv}-I_{leak\_bsd\_inv}\times(dV/dt)^{-1}$, and the first modified capacitance of the accumulation region is $C_{bsd\_acc\_mod}=C_{bsd\_acc}-I_{leak\_bsd\_acc}\times(dV/dt)^{-1}$.

Thereafter, the second modified capacitance having no leakage component between substrate (bulk) 110 and gate 150 can be measured with respect to the inversion region and the accumulation region by using the leakage current and the capacitance. First, the terminals are connected to substrate (bulk) 110 and gate 150. In this case, as illustrated in example, the high terminal can be connected to substrate (bulk) 110 and the low terminal can be connected to gate 150. Next, operation voltage $V_g$ can be applied to gate 150 by using leakage current measuring device 425 to thereby measure leakage current $I_{leak\_b\_inv}$ of the inversion region and leakage current $I_{leak\_b\_acc}$ of the accumulation region. The high terminal can then be connected to substrate (bulk) 110 and the low terminal can be connected to gate 150 by using capacitance measuring device (LCR meter) 420 to thereby measure capacitance $C_{b\_inv}$ of the inversion region and capacitance $C_b$ acc of the accumulation region.

Thereafter, the second modified capacitance having no leakage component can be obtained in which second modified capacitance $C_{b\_inv\_mod}$ of the inversion region is $C_{b\_inv\_mod} = C_{b\_inv} - I_{leak\_b\_inv} \times (dV/dt)^{-1}$ and second modified capacitance $C_{b\_acc\_mod}$ of the accumulation region is $C_{b\_acc\_mod} = C_{b\_acc} - I_{leak\_b\_acc} \times (dV/dt)^{-1}$.

Next, overlap capacitance can be measured using the first modified capacitance and the second modified capacitance. The overlap capacitance can be measured, in which overlap capacitance $C_{sd\_inv}$ of the inversion region is $C_{sd\_inv} = C_{bsd\_inv\_mod} - C_b\,inv_{\_mod}$, and overlap capacitance $C_{sd\_acc}$ of the accumulation region is $C_{sd\_acc} = C_{bsd\_acc\_mod} - C_{b\_acc\_mod}$.

Thereafter, as described above, in order to obtain the effective channel width and the effective channel length, gate channel capacitance $C_{gc}$ is found.

As illustrated in example FIG. 7, in order to measure the effective channel width, $C_{gc}$ can be obtained by changing gate mask channel width $W_{mask}$ in a state in which gate mask channel length $L_{mask}$ is fixed in the relationship of $C_{gc} = C_{sd\_inv} - C_{sd\_acc} = C_{ox} W_{eff} L_{mask} = C_{ox} L_{mask}(W_{mask} - \Delta W)$. For example, the $C_{gc}$ is obtained when gate mask channel width $W_{mask}$ is 1.5 μm and gate mask channel length $L_{mask}$ is fixed to 0.13 μm.

Thereafter, the $C_{gc}$ can be obtained when gate mask channel width $W_{mask}$ is 1.0 μm and gate mask channel length $L_{mask}$ is fixed to 0.13 μm. In addition, $C_{gc}$ can be obtained when gate mask channel width $W_{mask}$ is 0.5 μm and gate mask channel length $L_{mask}$ is fixed to 0.13 μm.

Next, a graph can be drawn by employing $C_{gc}$ and mask channel width $W_{mask}$ as X and Y axes, respectively. The value of $\Delta W$ can be obtained by finding the interconnection point between X and Y axes in the graph. Further, $\Delta W$ may be subtracted from mask channel width $W_{mask}$, thereby obtaining effective channel width $W_{eff}$.

As illustrated in example FIG. 8, in order to measure the effective channel length, $C_{gc}$ can be obtained by changing gate mask channel length $L_{mask}$ in a state in which gate mask channel width $W_{mask}$ is fixed in the relationship $C_{gc} = C_{sd\_inv} - C_{sd\_acc} = C_{ox} W_{mask} L_{eff} = C_{ox} W_{mask}(L_{mask} - \Delta L)$. For example, $C_{gc}$ can be obtained when gate mask channel length $L_{mask}$ is 1.5 μm, and gate mask channel width $W_{mask}$ is fixed to 0.5 μm. $C_{gc}$ can be obtained when gate mask channel length $L_{mask}$ is 1.4 μm, and gate mask channel width $W_{mask}$ is fixed to 0.5 μm. In addition, $C_{gc}$ can be obtained when gate mask channel length $L_{mask}$ is 0.13 μm, and gate mask channel width $W_{mask}$ is fixed to 0.5 μm.

Next, a graph can be drawn by employing $C_{gc}$ and mask channel length $L_{mask}$ as X and Y axes, respectively. The value of $\Delta L$ can be obtained by finding the interconnection point between the X axis and the Y axis in the graph. In addition, $\Delta L$ can be subtracted from mask channel length $L_{mask}$, thereby obtaining effective channel length $L_{eff}$.

As described above, in the apparatus and the method for measuring the effective channel in accordance with embodiments, an automated system can be employed instead of a manual system, thereby removing error factors which may occur when measuring the effective channel. Accordingly, exact parameters can be extracted.

In addition, in accordance with embodiments, an algorithm for the measurement of an effective channel, which is adaptable for the automated system, can be developed. In this way an effective channel length and an effective channel width can be effectively and accurately measured.

In accordance with embodiments, in the capacitance method used to extract an effective channel length and an effective channel width, a source, a drain, and a substrate (bulk) can be connected to a high terminal, and a gate can be connected to a low terminal, thereby measuring capacitance $C_{bsd}$. Accordingly, it is unnecessary to ground the bulk terminal by using another terminal. In addition, the bulk and gate terminals can be connected to the high and low terminals, respectively, to measure capacitance $C_b$, so that the capacitance among the gate, the source, and the drain can be easily obtained.

Moreover, in accordance with embodiments, a leakage component according to a gate voltage can be automatically measured, and then reflected on a capacitance value, so that more accurate capacitance can be extracted.

Any reference in this specification to "one embodiment," "an embodiment," "example embodiment," etc., means that a particular feature, structure, or characteristic described in connection with the embodiment is included in at least one embodiment of the invention. The appearances of such phrases in various places in the specification are not necessarily all referring to the same embodiment. Further, when a particular feature, structure, or characteristic is described in connection with any embodiment, it is submitted that it is within the purview of one skilled in the art to effect such feature, structure, or characteristic in connection with other ones of the embodiments.

Although embodiments have been described with reference to a number of illustrative embodiments thereof, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. A method for measuring an effective channel comprising:
   connecting a substrate formed with a gate, a source, and a drain to testing terminal; and then
   measuring a first modified capacitance having no leakage component among the source, the drain, a bulk, and the gate with respect to an inversion region and an accumulation region of the substrate; and then
   measuring a second modified capacitance having no leakage component between the bulk and the gate with respect to the inversion region and the accumulation region of the substrate; and then
   measuring an overlap capacitance using the first modified capacitance and the second modified capacitance; and then
   measuring an effective channel width using the overlap capacitance, wherein said measuring a first modified capacitance comprises:
      connecting a high terminal to the source, the drain, and the bulk, and connecting a low terminal to the gate; and then
      measuring a leakage current $I_{leak\_bsd\_inv}$ of an inversion region and a leakage current $I_{leak\_bsd\_acc}$ of an accumulation region by applying an operation voltage $V_g$ to the gate using a leakage current measuring device; and then
      measuring a capacitance $C_{bsd\_inv}$ of the inversion region and a capacitance $C_{bsd\_acc}$ of the accumulation region by using a capacitance measuring unit; and then
      measuring the first modified capacitance having no leakage component among the source, the drain, the bulk, and the gate with respect to the inversion and accumulation regions by using the leakage current $I_{leak\_bsd\_inv}$ of the inversion region, the leakage current $I_{leak\_bsd\_acc}$ of the accumulation region the capacitance $C_{bsd\_inv}$ of the inversion region, and the capacitance $C_{bsd\_acc}$ of the accumulation region.

2. The method of claim 1, further comprising a step of measuring an effective channel length using the overlap capacitance after measuring the overlap capacitance.

3. The method of claim 1, wherein during measuring the first modified capacitance, the first modified capacitance $C_{bsd\_inv\_mod}$ of the inversion region is $C_{bsd\_inv\_mod}=C_{bsd\_inv}-I_{leak\_bsd\_inv}\times(dV/dt)^{-1}$ and the first modified capacitance $C_{bsd\_acc\_mod}$ of the accumulation region is $C_{bsd\_acc\_mod}=C_{bsd\_acc}-I_{leak\_bsd\_acc}\times(dV/dt)^{-1}$.

4. The method of claim 3, wherein measuring the second modified capacitance comprises:
   connecting the high terminal to the bulk, and connecting the low terminal to the gate; and then
   measuring a leakage current $I_{leak\_b\_inv}$ of the inversion region and a leakage current $I_{leak\_b\_acc}$ of the accumulation region by applying the operation voltage $V_g$ to the gate using the leakage current measuring device; and then
   measuring a capacitance $C_{b\_inv}$ of the inversion region and a capacitance $C_{b\_acc}$ of the accumulation region by using the capacitance measuring unit; and then
   measuring the second modified capacitance having no leakage component among the source, the drain, the bulk, and the gate with respect to the inversion and accumulation regions by using the leakage current $I_{leak\_b\_inv}$ of the inversion region, the leakage current $I_{leak\_b\_acc}$ of the accumulation region, the capacitance $C_{b\_inv}$ of the inversion region, and the capacitance $C_{b\_acc}$ of the accumulation region.

5. The method of claim 4, wherein during measuring the second modified capacitance, the second modified capacitance $C_{b\_inv\_mod}$ of the inversion region is $C_{b\_inv\_mod}=C_{b\_inv}-I_{leak\_b\_inv}\times(dV/dt)^{-1}$ and the second modified capacitance $C_{b\_acc\_mod}$ of the accumulation region is $C_{b\_acc\_mod}=C_{b\_acc}-I_{leak\_b\_acc}\times(dV/dt)^{-1}$.

6. The method of claim 5, wherein during measuring the overlap capacitance, an overlap capacitance $C_{sd\_inv}$ of the inversion region is $C_{sd\_inv}=C_{bsd\_inv\_mod}-C_{b\_inv\_mod}$ and an overlap capacitance $C_{sd\_acc}$ of the accumulation region is $C_{sd\_acc}=C_{bsd\_acc\_mod}-C_{b\_acc\_mod}$.

7. The method of claim 6, wherein measuring the effective channel width using the overlap capacitance comprises:
   measuring a gate channel capacitance $C_{gc}$ using the overlap capacitance; and then
   measuring the gate channel width by using the gate channel capacitance $C_{gc}$, wherein the gate channel capacitance $C_{gc}$ is measured using a relationship of $C_{gc}=C_{sd\_inv}-C_{sd\_acc}=C_{ox}WL=C_{ox}W_{mask}(L_{mask}-\Delta L)=C_{ox}L_{mask}(W_{mask}-\Delta W)$.

8. The method of claim 7, wherein measuring the effective channel width comprises:
   obtaining the gate channel capacitance $C_{gc}$ by changing a gate mask channel width $W_{mask}$ in a state in which a gate mask channel length $L_{mask}$ is fixed in $C_{gc}=C_{sd\_inv}-C_{sd\_acc}=C_{ox}W_{eff}L_{mask}=C_{ox}L_{mask}(W_{mask}-\Delta W)$; and then
   plotting a graph employing the $C_{gc}$ and the gate mask channel width $W_{mask}$ as X and Y axes, respectively, and obtaining $\Delta W$ by finding an interconnection point of the X and Y axes; and then
   obtaining the effective channel width $W_{eff}$ by subtracting the $\Delta W$ from the gate mask channel width $W_{mask}$.

9. The method of claim 7, wherein measuring the effective channel length comprises:
   obtaining the gate channel capacitance $C_{gc}$ by changing a gate mask channel length $L_{mask}$ in a state in which a gate mask channel width $W_{mask}$ is fixed in $C_{gc}=C_{sd\_inv}-C_{sd\_acc}=C_{ox}W_{mask}L_{eff}=C_{ox}W_{mask}(L_{mask}-\Delta L)$; and then
   plotting a graph employing the $C_{gc}$ and the gate mask channel length $L_{mask}$ as X and Y axes, respectively, and obtaining $\Delta L$ by finding an interconnection point of the X and Y axes; and then
   obtaining the effective channel length $L_{eff}$ by subtracting the $\Delta L$ from the gate mask channel length $L_{mask}$.

* * * * *